(12) United States Patent
Wang

(10) Patent No.: US 9,214,968 B2
(45) Date of Patent: Dec. 15, 2015

(54) APPARATUS AND METHODS FOR PROVIDING A POWER AMPLIFIER WITH INTERFERENCE CANCELLATION

(71) Applicant: Nokia Technologies Oy, Espoo (FI)

(72) Inventor: Zhancang Wang, Beijing (CN)

(73) Assignee: Nokia Technologies Oy, Espoo (FI)

( * ) Notice: Subject to any disclaimer, the term of this patent is extended or adjusted under 35 U.S.C. 154(b) by 49 days.

(21) Appl. No.: 13/949,493

(22) Filed: Jul. 24, 2013

(65) Prior Publication Data

US 2015/0031317 A1    Jan. 29, 2015

(51) Int. Cl.
*H04B 1/04* (2006.01)
*H04B 17/00* (2015.01)

(52) U.S. Cl.
CPC ...... *H04B 1/0475* (2013.01); *H04B 2001/0441* (2013.01)

(58) Field of Classification Search
CPC ........ H04B 1/04; H04B 1/0475; H04B 10/50; H04B 2001/0408; H04B 2001/0416; H04B 2001/0425; H03F 1/3241; H03F 1/3282; H03F 2201/3221
USPC ............ 455/63.1, 67.11, 67.13, 114.2, 114.3, 455/115.1, 115.2, 127.1, 127.2; 375/296, 375/297; 330/149
See application file for complete search history.

(56) References Cited

U.S. PATENT DOCUMENTS

| | | | | |
|---|---|---|---|---|
| 5,959,499 | A * | 9/1999 | Khan et al. | 330/149 |
| 6,452,446 | B1 | 9/2002 | Eisenberg et al. | |
| 6,836,671 | B2 * | 12/2004 | Haigh et al. | 455/114.2 |
| 7,333,561 | B2 * | 2/2008 | Pinckley et al. | 375/297 |
| 7,348,844 | B2 | 3/2008 | Jaenecke | |
| 8,064,856 | B2 * | 11/2011 | Singerl et al. | 455/127.1 |
| 8,249,530 | B2 * | 8/2012 | Sun et al. | 455/127.1 |
| 8,576,943 | B2 * | 11/2013 | Kilambi et al. | 375/296 |
| 2009/0251211 | A1 * | 10/2009 | Martin et al. | 330/149 |
| 2013/0082774 | A1 * | 4/2013 | Xing et al. | 330/149 |
| 2014/0162712 | A1 * | 6/2014 | Feld et al. | 455/63.1 |

FOREIGN PATENT DOCUMENTS

EP    0998028 A1    5/2000

OTHER PUBLICATIONS

"Increasing Output Power and Efficiency of Microwave P2P Systems: Linearizing GaN Microwave Power Amplifiers Using RF Predistortion", Scintera Networks and Sumitomo Electric, Apr. 17, 2013, pp. 1-69.

(Continued)

*Primary Examiner* — Quochien B Vuong
(74) *Attorney, Agent, or Firm* — Harrington & Smith

(57) ABSTRACT

Methods and apparatus are provided for amplifying an input signal. An electronic circuit system comprises a first circuit comprising a power amplifier, configured to receive a first branch of an input signal, and generate a first amplified signal based on the input signal of the first branch; a second circuit, configured to receive a second branch of the input signal, generate a cancellation signal based on the input signal of the second branch, and combine the first amplified signal and the cancellation signal to generate a second amplified signal. The second circuit comprises an interference re-construction module, which is configured to model an inverse characteristic of residual distortion and interference of the first circuit via a predefined re-construction function, and generate an anti-phased interference signal based on the input signal of the second branch and the predefined re-construction function. The cancellation signal is generated from the anti-phased interference signal.

13 Claims, 6 Drawing Sheets

(56) References Cited

OTHER PUBLICATIONS

"Linearizing Microwave Transmission Power Amplifiers: Using SC1894 RFPAL to Improve ACP, EVM & Efficiency", Application Note 102, Scintera Networks, Oct. 2012, pp. 1-9.

"RF Predistortion (RFDP) vs. Digital Predistortion (DPD)", Scintera, Retrieved on May 28, 2014, Webpage available at : http://www.scintera.com/technology/rf-predistortion-rfpd-vs-digital-predistortion-dpd/.

* cited by examiner

APPARATUS AND METHODS FOR PROVIDING A POWER AMPLIFIER WITH INTERFERENCE CANCELLATION

FIELD OF THE INVENTION

The present invention generally relates to a radio frequency power amplifier. More specifically, the invention relates to an apparatus and methods for providing a power amplifier with interference cancellation.

BACKGROUND

As well known in the art, the power amplifier design requires high efficiency and high linearity. The efficiency of radio frequency power amplifier is generally defined as a ratio between a desired transmitted power and the total power from power supplies. Consequently, extensive efforts are made within the wireless industry for the means of enhancing efficiency. A little improvement in the efficiency of a power amplifier can make substantial profit available in a wireless communication system or terminal and cut the overall costs needed to operate the wireless communication infrastructure or terminal.

A high linearity with low interference and noise is also important for a radio frequency power amplifier and a whole wireless communication system. In a wireless communication system, antenna filter in a transmitter are one of the most important component to filter out the noise and interference to keep the transmitter meet the requirements for different regions and standards. However, with ever emerging frequency bands, the requirements of antenna filter is ever increasing and challenging to suppress the interference and noise generated from radio frequency power amplifiers. In this regard, with more and more frequency bands for the 4th generation communication (4G) and beyond, requirements for an antenna filter in a transmitter are ever higher to be achieved, which are very challenging to the existing filter technology. For example, co-site and co-existence require more and more challenge filters or interference filtering requirements. Some of the operating frequency bands (e.g. band 1#-41#) specified for the 4G LTE systems require a very tight transmitter antenna filtering. However it seems to be impossible to achieve the requirements by using only one antenna filter. Moreover, there are also some new frequency bands introduced into the LTE advanced which are not yet specified in detail so that are yet to be seen. These non-continuous frequency bands could also cause challenging filter requirements.

In view of this, it is highly desired to alleviate the requirements of transmitter antenna filter from a side of a radio frequency power amplifier, rather than antenna filters design, to minimize the interference and noise generated from a radio frequency power amplifier.

SOME EXAMPLE EMBODIMENTS

To overcome limitations described above, and to overcome other limitations that will be apparent upon reading and understanding the present specification, the disclosure provides a radio frequency power amplifier with interference cancellation and a method for providing radio frequency power amplifying with interference cancellation.

According to one embodiment, an electronic circuit system for amplifying an input signal. The electronic circuit system comprises a first circuit comprising a power amplifier, configured to receive a first branch of an input signal, and generate a first amplified signal based on the input signal of the first branch. The electronic circuit system further comprises a second circuit, configured to receive a second branch of the input signal, generate a cancellation signal based on the input signal of the second branch, and combine the first amplified signal and the cancellation signal to generate a second amplified signal. The second circuit comprises an interference re-construction module, which is configured to model an inverse characteristic of residual distortion and interference of the first circuit via a predefined re-construction function, and generate an anti-phased interference signal based on the input signal of the second branch and the predefined re-construction function. The cancellation signal is generated from the anti-phased interference signal.

According to another embodiment, a method for amplifying an input signal. The method comprises amplifying the input signal via a power amplifier in a first circuit to generate a first amplified signal in a first circuit. The method further comprises generating a cancellation signal based on the input signal in a second circuit. The method further comprises combining the first amplified signal and the cancellation signal to generate a second amplified signal. The cancellation signal is generated by modeling an inverse characteristic of residual distortion and interference of the first circuit via a predefined re-construction function, constructing an anti-phased interference signal based on the input signal and the predefined re-construction function, and generating the cancellation signal from the anti-phased interference signal.

Still other aspects, features, and advantages of the invention are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive.

BRIEF DESCRIPTION OF THE DRAWINGS

The embodiments of the invention are illustrated by way of example, and not by way of limitation, in the figures of the accompanying drawings.

DESCRIPTION OF SOME EMBODIMENTS

Figure 1:
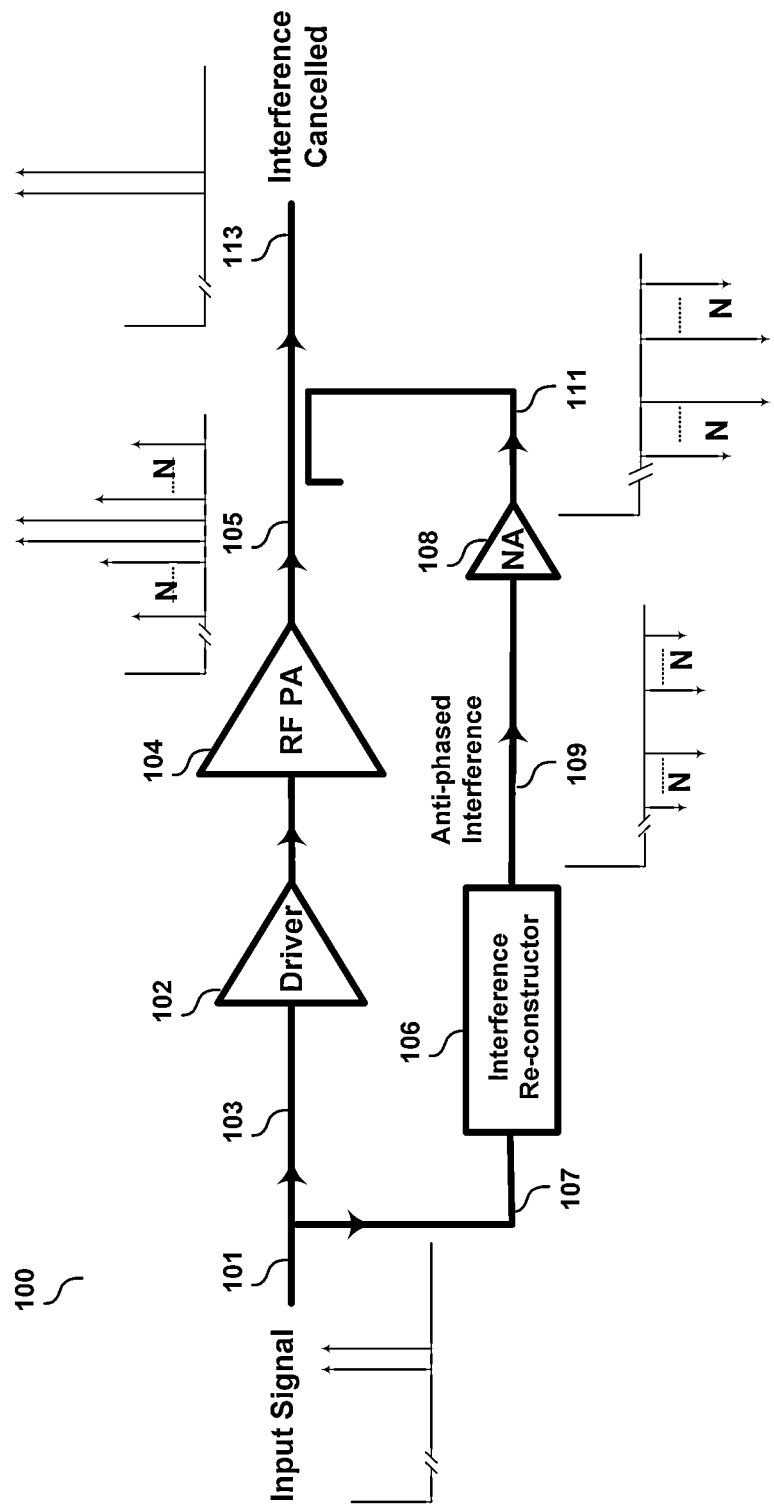
FIG. 1 illustrates a block diagram schematic of an interference cancellation in an amplifier circuit system according to an embodiment of the present invention.

Examples of apparatus and methods for a power amplifier with interference cancellation are disclosed. Like reference numerals refer to like elements throughout. It should be appreciated that single features of different embodiments may also be combined to provide other embodiments. Furthermore, words "comprising" and "including" should be understood as not limiting the described embodiments to consist of only those features that have been mentioned and such embodiments may contain also features/structures that have not been specifically mentioned.

FIG. 1 illustrates a block diagram schematic of an interference cancellation in an amplifier circuit system according to an embodiment of the present invention. Similar as a traditional amplifier circuit, the amplifier circuit system 100 comprises a main signal path, through which an input signal 101 can be amplified via a main power amplifier, e.g. a radio frequency power amplifier (RF PA) 104. In some embodiments, before being fed into the RF PA 104, the input signal 101 can pass through some intermediate amplifiers, such as a driver amplifier 102, so as to provide sufficient power gain to meet a requirement of the RF PA 104 for input. In FIG. 1 and other FIGS. of the description, in order to illustrating a processing on the signals in the circuit intuitively, a schematic of two tone signal chart is shown near a reference numeral of a signal to illustrate an exemplary sample of the wide band signal in a frequency domain. For example, the signal chart near the reference numeral 101 is shown to illustrate an exemplary input signal 101; and another schematic signal chart is shown near the reference numeral 105 to illustrate an exemplary amplified signal outputted from the RF PA 104 in a frequency domain. As can be seen from these two signal charts, there are much interferences and residual distortions introduced into the output signal while amplifying the input signal.

To cancel the interferences and residual distortions caused by the main signal path, the amplifier circuit system 100 introduces an interference signal path to generate a cancellation signal with a characteristic inverse to the characteristic of interference and residual distortion of the main signal path. In this regard, the input signal 101 can be divided into two branch signals, one divided branch signal 103 is fed into the main signal path to be amplified by RF PA 104, and another divided branch signal 107 is fed into the interference signal path. The interference signal path comprises an interference re-construction module 106, which constructs an anti-phased interference signal 109 based on the input signal 107 and a predefined re-construction function. The predefined re-construction function can model an inverse characteristic of residual distortion and interference of the main signal path. For example, the anti-phased interference signal 109 can be constructed by using at least one of a direct look-up table (LUT) or volterra series and its variants e.g. memory polynomial function. As shown in the signal chart near the reference numeral 109, the anti-phased interference signal can be constructed to have an inverse characteristic of the residual distortion and interference part in the amplified signal 105. To make the gain of the anti-phased interference signal 109 match the residual distortion and interference part in the amplified signal 105, the anti-phased interference signal 109 can be further amplified by a noise amplifier 108.

The output from the noise amplifier 108 can be combined into the amplified signal 105 outputted from PF PA 104, for example via a summing node. At the summing node, the amplified anti-phased interference signal 111 from the interference signal path is added to the amplified signal 105 in 180° phase shift for cancellation processing. The signal 111 and the residual distortion and interference part of the signal 105 are of equal amplitudes, but 180° out of phase. In practice, to keep the 180° out of phase between signal 111 and signal 105, variable delay blocks can be embedded into the main signal path and/or interference signal path, e.g. in the interference re-construction module 106. Thus, ideally the residual distortion and interference part in the signal 105 can be removed (or at least reduced) and only the main signal part is remained, as shown by the signal chart near the reference numeral 113.

Figure 2:
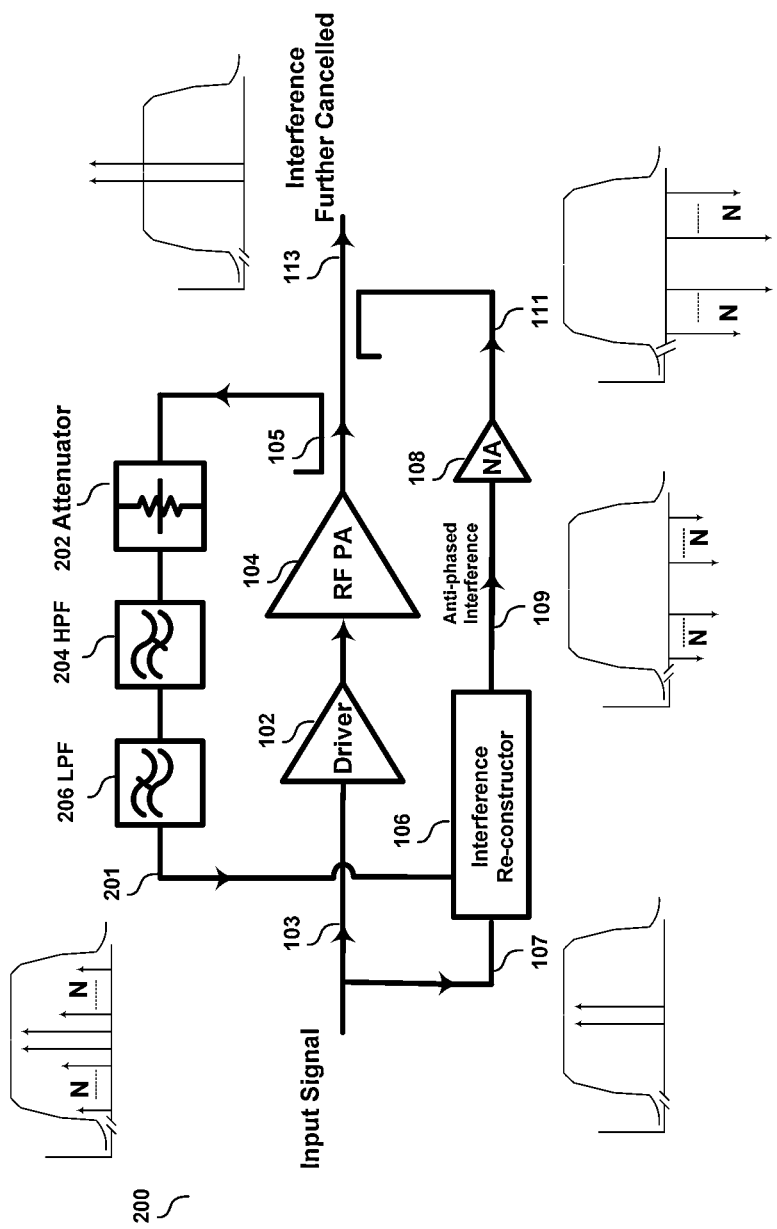
FIG. 2 illustrates a block diagram schematic of an interference cancellation in an amplifier circuit system with adaptive coefficient updates according to another embodiment of the present invention.

In some embodiments, the coefficients of the interference re-construction module can be adaptively updated according to a feedback observation signal 201 from the main signal path real-timely. As shown in FIG. 2, the amplified input signal 105 of RF PA 104 can be feedback to the interference re-constructor through a feedback path which includes an attenuator 202, and a high-pass filter (HPF) 204 and a low-pass filter (LPF) 206. The attenuator can decrease the power of the coupled signal 105 into a level which the interference re-construction module can accept for processing. The signal chart near the reference numeral 201 illustrates an exemplary feedback signal 201. According to the feedback signal, the interference re-construction module 106 can observe the change in the characteristics of residual distortion and interference in the main signal path real-timely, and adjust its model coefficients adaptively. The coefficients of the interference re-construction module can be adjusted in either digital or analogue methods. After the coefficients becoming stable and constant, the feedback path can be switch off for power saving. As such, the modeling of the interference re-construction module can be more immune to the time-varying interferences in the main signal path.

Figure 3:
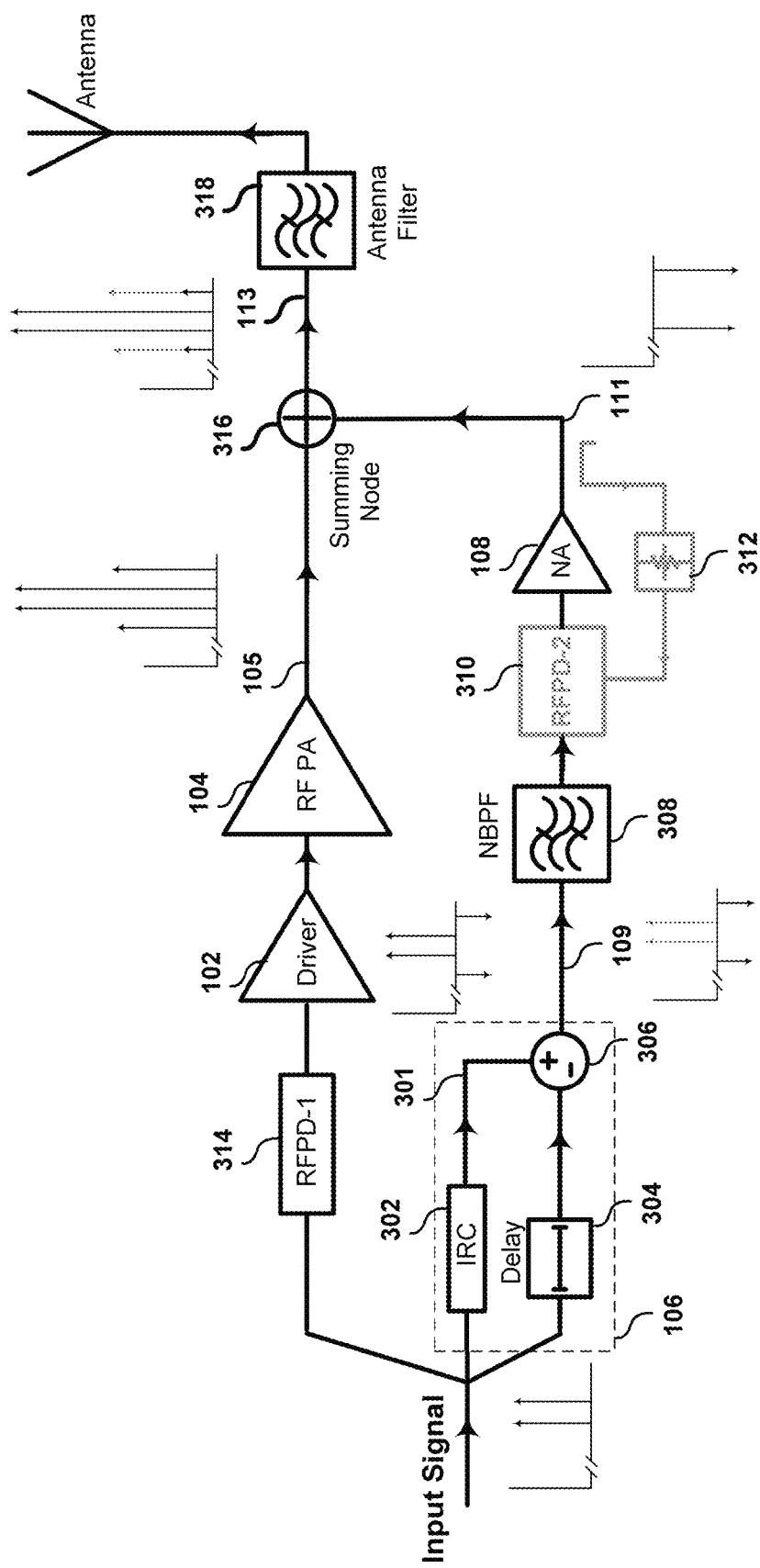
FIG. 3 illustrates a block diagram schematic of an interference cancellation in an amplifier circuit system with more details according to an embodiment of the present invention.

FIG. 3 illustrates a block diagram schematic of an interference cancellation in an amplifier circuit system with more details according to an embodiment of the present invention. The amplifier circuit system can be configured in a transmitter in a wireless communication system, e.g. in a mobile terminal or a base station, for amplifying radio frequency signals to be transmitted via antennas. As shown in FIG. 3, the interference re-construction module 106 can includes an interference re-constructor (IRC) 302, a delay unit 304, and a subtracter 306. The interference re-constructor 302 models an inverse characteristic of residual distortion and interference of the main signal path, especially the RF PA 104, and generates an interference re-construction signal 301 based on the input signal. The coefficients of the IRC 302 can be properly set, to make the interference re-construction signal 301 consists of two parts: a main signal from input, and an anti-phased interference signal which has an inverse characteristic of residual distortion and interference of the main signal path. The signal chart near the reference numeral 301 illustrates an exemplary interference re-construction signal 301. In some embodiments, the IRC 302 can be implemented to bypass the main signal (i.e. the input signal) from input and re-construct an anti-phased interference signal with at least of LUT, or volterra series or memory polynomial models.

The interference re-construction signal 301 is fed into a subtracter 306. At the mean time a divided input signal is delayed by a delay unit 304, and then also fed into the subtracter 306, for subtracting the main signal from the interference re-construction signal 301. As showed in the signal chart near the reference numeral 109, the main signal (as shown in grey dashed lines) is removed, and only the anti-phased interference signal is remained alone.

After a linear amplification in the noise amplifier (NA) 108 of the re-constructed anti-phased interference signal 109, the amplified anti-phased interference signal 111 can be combined with the output signal 105 of the RF PA 104 via a summing node 316 for interference cancellation. As such, the interference part of the RF PA output signal can be significantly reduced as shown in the signal chart near the reference numeral 113. Then the main transmitting signal is forwarded to a transmitter antenna filter 318 and further to an antenna. As such, the interference and noise cancellation on a radio frequency power amplifier can alleviate the requirements of the transmitter antenna filter.

In some embodiments, the anti-phased interference signal outputted from the subtracter 306 can be fed to a noise amplifier 108 through an optional noise band pass filter (NBPF) 308, which can be fixed at a centre frequency or be tunable to fit for a centre frequency of an output signal of the amplifier circuit system.

In some embodiments, the NA 108 can be configured as a pre-distortion amplifier. In this regard, a radio frequency pre-distorter (RFPD) 310 can be applied to the anti-phased interference signal, which is looping the NA 108 adaptively, for preventing inter-modulation distortions (IMD) and interference re-growth of the NA 108 and eliminating the non-linearity of the NA 108. Further, an attenuator 312 can be arranged in an observation path of the RFPD 310, for feed backing suitable samples from the output of NA 108 to RFPD 310, so as to calculate pre-distortion coefficients for compensating the IMD and interference of the NA 108. Therefore, RFPD 310 is optional located on the interference signal path to due to a nonlinear effect of the NA 108. That is, the necessity of this RFPD 310 depends on the IMD and noise re-growth level and impact of the NA 108 to an interference cancellation performance of the whole amplifier circuit system. In case of the IMD and noise re-growth level and impact of the NA 108 exceed an acceptance level, the optional RFPD 310 will be applied on the NA 108 to linearize it and keep the spectrum clean for the final interference cancellation.

In some embodiments, the input signal in the main signal path can be adaptively radio frequency pre-distorted, to attenuate the distortion of the driver amplifier 102 and the RF PA 104 as much as possible. A radio frequency pre-distorter (RFPD) 314 can be located in serial in the main signal path. Similar as the RFPD 310, the RFPD 314 can also have an observation path (not shown in FIG. 3) which feedbacks the samples from the outputs of the driver amplifier 102 and the RF PA 104 adaptively, to calculation the pre-distortion coefficients for compensating the IMD of the driver amplifier 102 and the RF PA 104 up to $N^{th}$ order.

Figure 4:
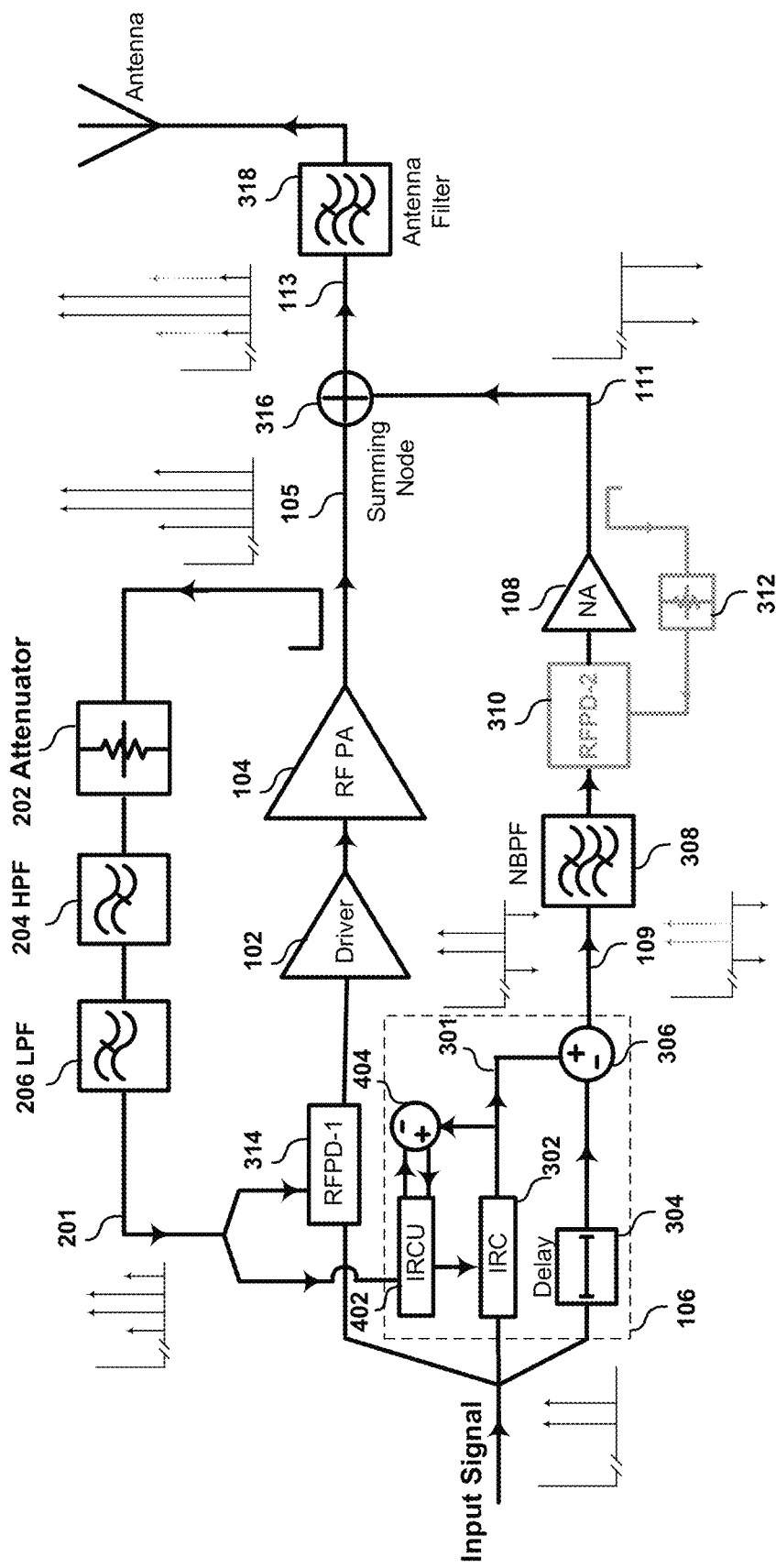
FIG. 4 illustrates a block diagram schematic of an interference cancellation in an amplifier circuit system with more details according to another embodiment of the present invention.

In some embodiments, the observation path of RFPD 314 can reuse the feedback path for adaptive coefficient update of the interference re-construction module. FIG. 4 illustrates an exemplary embodiment in this regard. As shown in FIG. 4, the feedback signal 201 can be divided into two, and a first divided feedback signal is fed into RFPD 314, and a second divided feedback signal is fed into the interference re-construction module 106. The RFPD 314 and the interference re-construction module 106 can use the feedback path and work interleaved. The interference re-construction module 106 can further comprise an interference re-construction updater (IRCU) 402, which trains the coefficients of IRC 302 with the feedback signal. The coefficient update for IRC 302 will be described in details below, with reference to FIG. 5.

Figure 5:
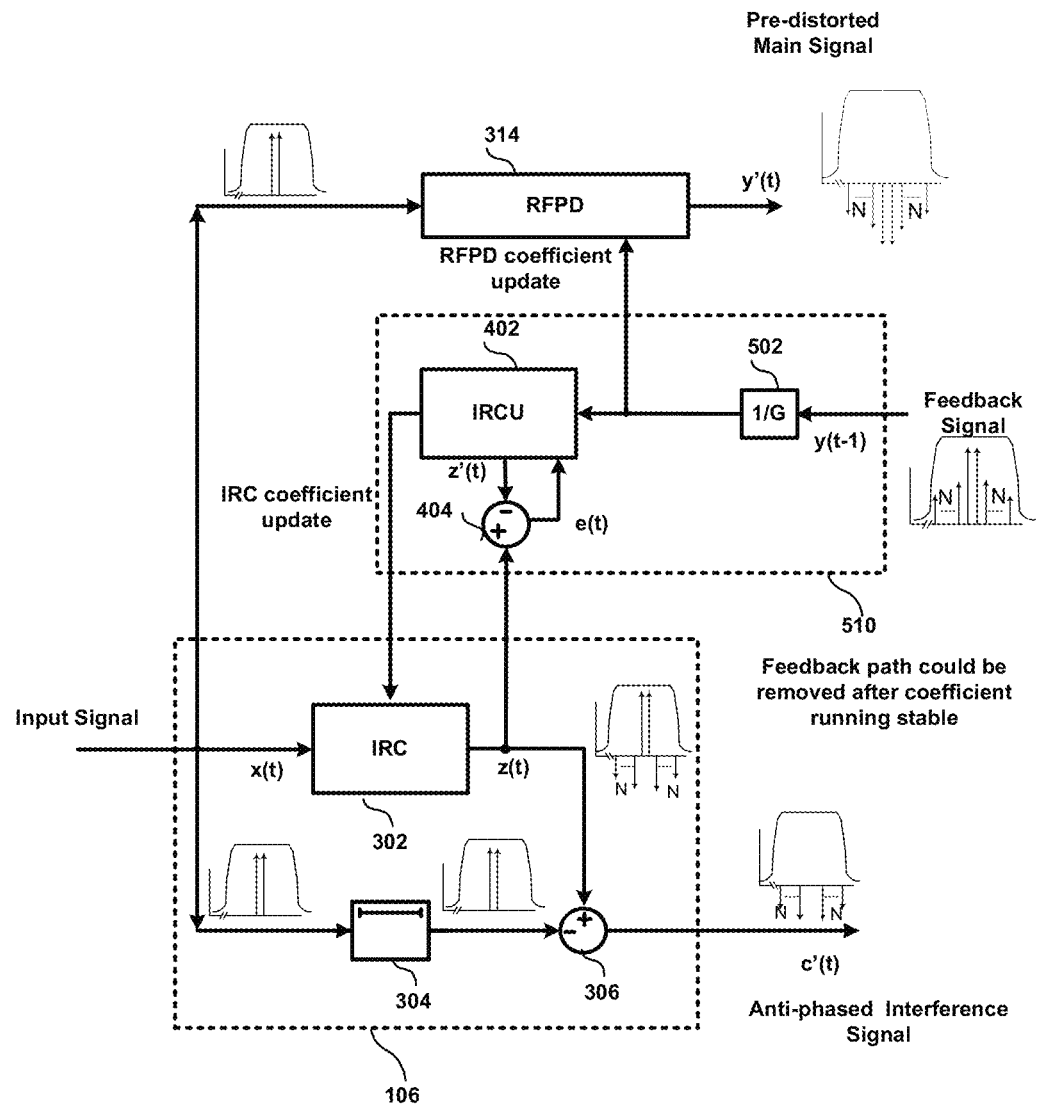
FIG. 5 is a schematic diagram illustrating signal flows of a signal pre-distortion and interference re-construction, according to embodiments of the present invention.

IRCU 402 receives a feedback signal from the output of the main signal path. IRCU 402 models the residual distortion and interference of the main signal path which can comprise a RFPD 314, a driver amplifier 102 and a RF PA 104. In an embodiment, a model of IRC 302 can be a complete inverse to the model of IRCU 402. IRC 302 and IRCU 402 respectively stand for the normal and inverse models of residual distortion and interference for nonlinearity in both amplitude and phase aspect. For example, the models of IRC 302 and IRCU 402 can be indicated by their signal processing functions with equations. For example, the signal processing functions of IRC 302 and IRCU 402 can be expressed as polynomials as below:

IRCU: $x(t) = a_1 \cdot y(t) + a_2 \cdot y(t) \cdot |y(t)|^2 + a_3 \cdot y(t) \cdot |y(t)|^3 + \ldots + a_n \cdot y(t) \cdot |y(t)|^n$, IRC: $y(t) = b_1 \cdot x(t) + b_2 \cdot x(t) \cdot |x(t)|^2 + b_3 \cdot x(t) \cdot |x(t)|^3 + \ldots + b_n \cdot x(t) \cdot |x(t)|^n$, where, n=1,2,3, . . . , and $a_i$ and $b_i$ (i=1, 2, 3, . . . n) are complex coefficients; x(t) and y(t) are the complex equivalents of the input and output sample signals of the main signal path in time domain, respectively. The parameter n should be properly chosen so that the residual distortion and interference of the outputted signal after the main signal path are compensated by IRC 302, which can be significantly smaller than a threshold level of noise to be accepted. As shown in FIG. 5, the output sample signals of the main signal path at a time instant t−1, y(t−1), is fed to IRCU 402, after a gain reduction of 1/G, for example by the attenuator 202 as shown in FIG. 4. According to y(t−1), IRCU 402 can estimate its model coefficients ($a_1, a_2, a_3, \ldots a_n$) with a feedback training engine, and output a model signal z'(t) substantially has the same characteristic as the extracted characteristic of residual distortion and interference of the attenuated sample signal y(t−1). IRCU 402 also provides update coefficients ($a_1, a_2, a_3, \ldots a_n$) to IRC 302. According to the newly received update coefficients IRC 302 can update its own model coefficients ($b_1, b_2, b_3, \ldots b_n$) for generating an inverse characteristic modeling. In this regard, IRC 302 can generate a re-constructed signal z(t) based on the input signal x(t) at time instant t by using its updated model, which contains a bypassed input signal x(t) and are-constructed anti-phased reference signal z"(t). The re-constructed signal z(t) outputted from IRC 302 can be compared to z'(t), for example via a subtracter, to obtain an error signal e(t). The error signal is feedback to the IRCU 402 for adjusting the IRC update coefficients to minimise the error between the feedback training engine of IRCU and the IRC by iterations.

With this IRCU 402 and IRC 302 internal feedback mechanism, the error signal can be minimized to an acceptable level, e.g. a predetermined threshold level. That means the re-construction function in IRC 302 are fully adaptive to current input signal x(t) for re-construction of the interference. Then, the coefficients of IRC 302 are finalized and the re-construction function of IRC 302 can be executed for generating c'(t). In this regard, with a combination at the subtracter 306, the bypassed input signal part x(t) can be removed from z(t), obtaining an output c'(t) with only the reconstructed anti-phased interference signal. In addition, IRCU 402 can stop the coefficient update to IRC 302, and thus the coefficients of IRCU 402 and IRC 302 both become stable. Then, the feedback path, IRCU 402 and the subtracter 404 as shown in block 510 can be switch off for power saving.

As discussed above, the RFPD 314 can pre-distort the input signal according to the feedback signal y(t−1). In this regard, RFPD 314 compares the input signal in the main signal path and the attenuated feedback signal, to check the gain and phase errors of the amplifiers in the main signal path. According to the comparison, the RFPD 314 can create a pre-distorted or inverse character version of a desired modulation signal. The RFPD 314 can consist of a complex gain and phase adjuster, which controls the amplitude and phase of the input signal. The amount of RF pre-distortion of RFPD 314 can be controlled by a memory polynomial function that interpolate a memory effect mitigation besides the AM/AM and AM/PM nonlinearities of the power amplifiers in the main signal path. For example, the memory polynomial function can be a simplified version or variant of volterra series, to deal with non-linearity with time varying.

In embodiments of the invention, variable delay blocks can be embedded into IRC 302 and RFPD 314 blocks, for matching delays of signal processing of the main signal path and the interference signal path. The variable delay control can be implemented precisely, since the IRC 302 and RFPD 314 can be implemented in digital domain. It should be noted that, in the main signal path, there is no need adjust signal delay at the output end of the RF PA 104, so that the efficiency of the amplifier circuit can be highly enhanced.

Using the interference cancelation of the present invention as described above, the linearity performance of the radio frequency power amplifier can be enhanced significantly, so that the specification of antenna filter could be relaxed for size, cost, and causing design efforts saving from the overall system perspective.

Figure 6:
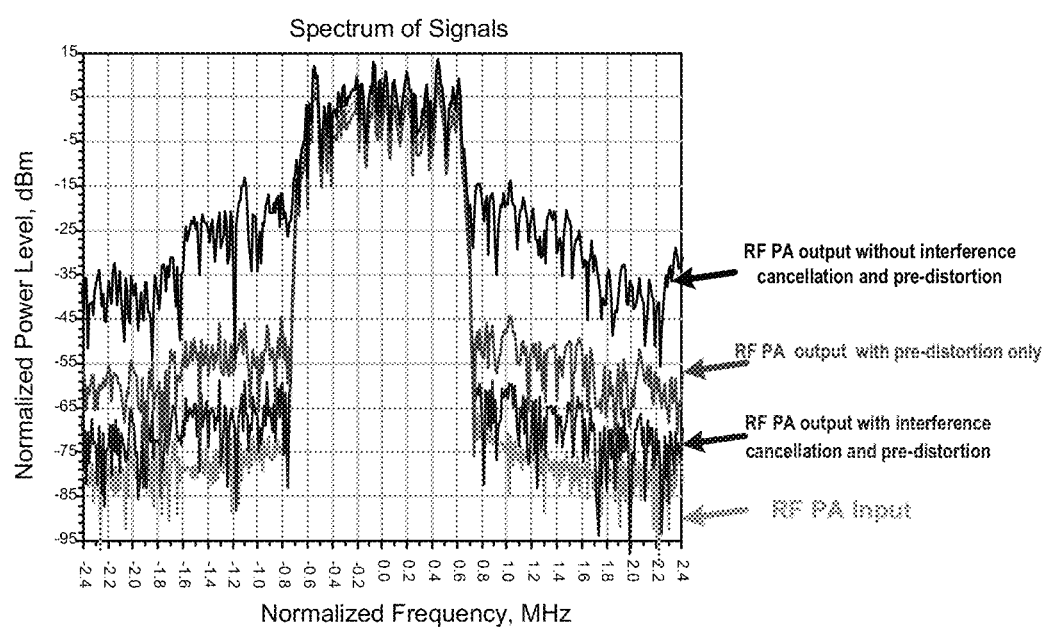
FIG. 6 are spectrum simulation results illustrating an interference cancellation performance of power amplifier circuits according to embodiments of the present invention compared to prior arts.

Lab simulation measurements of the embodiments are given in FIG. 6, which shows spectrums of an input signal and output signals through different power amplifier circuits. As indicated by the four arrows in FIG. 6, the spectrum of "RF PA output without interference cancellation and pre-distortion" is a simulation result of an output signal of RF PA (e.g. 104) in a case that the input signal is directly injected into the RF PA without pre-distortion and interference cancellation, such as the output signal 105 in FIG. 1. The spectrum of "RF PA output with pre-distortion only" is a simulation result of an output signal of RF PA (e.g. 104) in a case that the input signal is pre-distorted before being injected into the RF PA, but without interference cancellation, such as the output signal 105 in FIG. 3. The spectrum of "RF PA output with interference cancellation and pre-distortion" is a simulation result of an output signal of an amplifier circuit according to an embodiment of the present invention, in which the input signal is pre-distorted before being injected into the RF PA, and the output of the RF PA is combined with an re-constructed anti-phased interference signal for interference cancellation, such as the output signal 113 in FIG. 3. In these simulations, the input signal is a reverse link CDMA signal for the IS95 specification. The main target of the simulation was to make a CDMA modulated signal pass through an amplifier circuit and check the influence to the linearization performance of the amplifier circuit via ACLR simulation results. The simulation is made at 0.85 GHz centre frequency.

From the spectrums in FIG. 6, it can be seen that the amplifier circuit with interference cancellation and pre-distortion can make a significant (about total 43 dB) ACLR (Adjacent Channel Leakage Ratio) improvement over the solution which has no interference cancellation and pre-distortion, and also make a considerable (about 18 dB) ACLR improvement over the solution with only pre-distortion.

The present invention includes any novel feature or combination of features disclosed herein either explicitly or any generalization thereof. Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-Limiting and exemplary embodiments of this invention.

What is claimed is:

1. An electronic circuit system for amplifying an input signal, comprising:
   a first circuit comprising a power amplifier, configured to receive a first branch of an input signal, and generate a first amplified signal based on the input signal of the first branch; and
   a second circuit, configured to receive a second branch of the input signal, generate a cancellation signal based on the input signal of the second branch, and combine the first amplified signal and the cancellation signal to generate a second amplified signal,
   wherein the second circuit comprises an interference re-construction module, which is configured to model an inverse characteristic of a residual distortion and interference part of the first amplified signal via a predefined re-construction function, and generate an anti-phased interference signal based on the input signal of the second branch and the predefined re-construction function, wherein the cancellation signal is generated from the anti-phased interference signal, and wherein the cancellation signal has an approximately equal amplitude and is about 180 degrees out of phase with the residual distortion and interference part so that at least a portion of the residual distortion and interference part is removed when the first amplified signal is combined with the cancellation signal to generate the second amplified signal.

2. An electronic circuit system of claim 1, wherein the interference re-constructor model comprises:
   an interference re-constructor, configured to generate an interference re-construction signal based on the input signal of the second branch and the predefined re-construction function, wherein the interference re-construction signal comprises an bypassed input signal and the anti-phased interference signal which has an inverse characteristic of the residual distortion and interference part of the first amplified signal;
   a delayer, configured to delay the input signal of the second branch to match to a time for generating the interference re-construction signal, and provide a delayed input signal to a subtracter; and
   the subtracter, configured to subtract the delayed input signal from the interference re-construction signal to separate the anti-phased interference signal.

3. An electronic circuit system of claim 2, wherein the second circuit comprises a pre-distortion amplifier configured to amplify the separated anti-phased interference signal to output the cancellation signal.

4. An electronic circuit system of claim 2, further comprising:
   a third circuit, configured to receive the first amplified signal and attenuate the first amplified signal to generate a feedback signal; and
   wherein the interference re-constructor model further comprises an interference re-construction updater, configured to receive the feedback signal, adaptively model a characteristic of the residual distortion and interference part of the first amplified signal based on the feedback signal, and provide coefficients of the interference re-construction updater to the interference re-constructor to update coefficients of the re-construction function of the interference re-constructor.

5. An electronic circuit system of claim 4, wherein the first circuit comprises:
   a pre-distorter, configured to receive the input signal of the first branch and the feedback signal, and perform a predistortion processing on the input signal of the first branch based on the feedback signal, to provide a pre-distorted input signal to the power amplifier.

6. An electronic circuit system of claim 1, wherein the predefined re-construction function is at least one of a look-up table, volterra series, or a memory polynomial function.

7. A transmitter, comprising:
an electronic circuit system according to any one of claims 1-6, for amplifying a radio frequency signal; and
an antenna, configured to transmit the amplified radio frequency signal.

8. A method for amplifying an input signal, comprising:
amplifying the input signal via a power amplifier in a first circuit to generate a first amplified signal in a first circuit; and
generating a cancellation signal based on the input signal in a second circuit; and
combining the first amplified signal and the cancellation signal to generate a second amplified signal,
wherein the generating of the cancellation signal comprises:
modeling an inverse characteristic of a residual distortion and interference part of the first amplified signal via a predefined re-construction function;
constructing an anti-phased interference signal based on the input signal and the predefined re-construction function; and
generating the cancellation signal from the anti-phased interference signal, wherein the cancellation signal has an approximately equal amplitude and is about 180 degrees out of phase with the residual distortion and interference part so that at least a portion of the residual distortion and interference part is removed when the first amplified signal is combined with the cancellation signal to generate the second amplified signal.

9. A method of claim 8, wherein constructing an anti-phased interference signal comprises:
generating an interference re-construction signal, which comprises a bypassed input signal, and the anti-phased interference signal having an inverse characteristic of the residual distortion and interference part of the first amplified signal;
delaying the input signal to match a time for generating the interference re-construction signal; and
subtracting the delayed input signal from the interference re-construction signal to separate the anti-phased interference signal.

10. A method of claim 9, wherein generating the cancellation signal comprising:
amplifying the separated anti-phased interference signal by a pre-distortion amplifier to output the cancellation signal.

11. A method of claim 9, further comprising:
attenuating the first amplified signal to generate a feedback signal in a third circuit;
adaptively modeling a characteristic of the residual distortion and interference part of the first amplified signal based on the feedback signal in an interference re-construction updater; and
updating coefficients of the re-construction function according to model coefficients of the interference re-construction updater.

12. A method of claim 11, further comprising:
performing a pre-distortion processing on the input signal based on the feedback signal, to provide a pre-distorted input signal to the power amplifier.

13. A method of claim 8, wherein the predefined re-construction function is at least one of a look-up table, volterra series, or a memory polynomial function.

* * * * *